(12) United States Patent
Mateu et al.

(10) Patent No.: US 10,873,318 B2
(45) Date of Patent: Dec. 22, 2020

(54) FILTER CIRCUITS HAVING ACOUSTIC WAVE RESONATORS IN A TRANSVERSAL CONFIGURATION

(71) Applicant: Qorvo US, Inc., Greensboro, NC (US)

(72) Inventors: Jordi Mateu, Tarragona (ES); Carlos Collado Gomez, Barcelona (ES); Alberto Hueltes Escobar, Barcelona (ES); Robert Aigner, Ocoee, FL (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 203 days.

(21) Appl. No.: 16/003,417

(22) Filed: Jun. 8, 2018

(65) Prior Publication Data

US 2018/0358947 A1    Dec. 13, 2018

Related U.S. Application Data

(60) Provisional application No. 62/516,725, filed on Jun. 8, 2017.

(51) Int. Cl.
*H03H 9/54* (2006.01)
*H03H 7/075* (2006.01)
(Continued)

(52) U.S. Cl.
CPC ............ *H03H 9/542* (2013.01); *H03H 7/075* (2013.01); *H03H 7/1725* (2013.01); *H03H 7/18* (2013.01);
(Continued)

(58) Field of Classification Search
CPC ........ H03H 7/075; H03H 7/1725; H03H 7/18; H03H 7/38; H03H 7/42; H03H 9/542; H03H 9/605; H03H 9/64; H03H 9/6483
(Continued)

(56) References Cited

U.S. PATENT DOCUMENTS 3,731,230 A    5/1973  Cerny, Jr.
3,875,533 A    4/1975  Irwin et al.
(Continued)

FOREIGN PATENT DOCUMENTS

JP    2012257050 A    12/2012

OTHER PUBLICATIONS

Non-Final Office Action for U.S. Appl. No. 15/697,658, dated May 1, 2019, 13 pages.
(Continued)

*Primary Examiner* — Benny T Lee
*Assistant Examiner* — Hafizur Rahman
(74) *Attorney, Agent, or Firm* — Withrow & Terranova, P.L.L.C.

(57) ABSTRACT

Filter circuits having acoustic wave resonators in a transversal configuration are disclosed. In the transversal configuration, the acoustic wave resonators are arranged transverse to an input and output port of the filter circuit. As such, all the acoustic wave resonators of the filter circuit are connected to the input port and connected to the output port. In the transversal configuration, the filter circuit can be designed for any transfer function without being restricted to a coupling coefficient of a piezoelectric material used in the acoustic wave resonators. In this regard, the filter circuit can achieve very wideband filter responses, multiband responses, and/or responses with arbitrary position of transmission zeros. The filter circuit having the transversal configuration can also be designed for complex transmission zeros for phase equalization.

20 Claims, 5 Drawing Sheets

(51) Int. Cl.
*H03H 7/01* (2006.01)
*H03H 7/18* (2006.01)
*H03H 9/64* (2006.01)
*H03H 7/42* (2006.01)
*H03H 7/38* (2006.01)
*H03H 9/60* (2006.01)

(52) U.S. Cl.
CPC .............. *H03H 7/38* (2013.01); *H03H 7/42* (2013.01); *H03H 9/605* (2013.01); *H03H 9/64* (2013.01); *H03H 9/6483* (2013.01)

(58) Field of Classification Search
USPC .......................................................... 333/25
See application file for complete search history.

(56) References Cited

U.S. PATENT DOCUMENTS

| | | | |
|---|---|---|---|
| 4,442,434 | A | 4/1984 | Baekgaard |
| 4,577,168 | A | 3/1986 | Hartmann |
| 5,291,159 | A | 3/1994 | Vale |
| 6,067,391 | A | 5/2000 | Land |
| 6,670,866 | B2 | 12/2003 | Ellaet et al. |
| 6,714,099 | B2 | 3/2004 | Hikita et al. |
| 6,720,844 | B1 | 4/2004 | Lakin |
| 6,927,649 | B2 | 8/2005 | Metzger et al. |
| 6,927,651 | B2 | 8/2005 | Larson, III et al. |
| 6,975,183 | B2 | 12/2005 | Aigner et al. |
| 7,057,478 | B2 | 6/2006 | Korden et al. |
| 7,173,504 | B2 | 2/2007 | Larson, III et al. |
| 7,239,067 | B2 | 7/2007 | Komuro et al. |
| 7,321,183 | B2 | 1/2008 | Ebuchi et al. |
| 7,342,351 | B2 | 3/2008 | Kubo et al. |
| 7,391,285 | B2 | 6/2008 | Larson, III et al. |
| 7,436,269 | B2 | 10/2008 | Wang et al. |
| 7,804,374 | B1 | 9/2010 | Brown et al. |
| 7,825,749 | B2 | 11/2010 | Thalhammer et al. |
| 7,855,618 | B2 | 12/2010 | Frank et al. |
| 7,889,024 | B2 | 2/2011 | Bradley et al. |
| 7,898,493 | B1 | 3/2011 | Rojas et al. |
| 7,956,705 | B2 | 6/2011 | Meister et al. |
| 7,973,620 | B2 | 7/2011 | Shirakawa et al. |
| 8,248,185 | B2 | 8/2012 | Choy et al. |
| 8,508,315 | B2 | 8/2013 | Jamneala et al. |
| 8,575,820 | B2 | 11/2013 | Shirakawa et al. |
| 8,576,024 | B2 | 11/2013 | Erb et al. |
| 8,923,794 | B2 | 12/2014 | Aigner |
| 8,981,627 | B2 | 3/2015 | Sakuma et al. |
| 8,991,022 | B2 | 3/2015 | Satoh et al. |
| 9,054,671 | B2 | 6/2015 | Adkisson et al. |
| 9,054,674 | B2 | 6/2015 | Inoue et al. |
| 9,197,189 | B2 | 11/2015 | Miyake |
| 9,243,316 | B2 | 1/2016 | Larson, III et al. |
| 9,484,883 | B2 | 11/2016 | Nishizawa et al. |
| 9,698,756 | B2 | 7/2017 | Khlat et al. |
| 9,837,984 | B2 | 12/2017 | Khlat et al. |
| 9,847,769 | B2 | 12/2017 | Khlat et al. |
| 9,887,686 | B2 | 2/2018 | Kuwahara |
| 9,929,716 | B2 | 3/2018 | Lee et al. |
| 10,009,001 | B2 | 6/2018 | Jiang et al. |
| 10,141,644 | B2 | 11/2018 | Khlat et al. |
| 2002/0109564 | A1 | 8/2002 | Tsai et al. |
| 2005/0093648 | A1 | 5/2005 | Inoue |
| 2005/0206476 | A1 | 9/2005 | Ella et al. |
| 2006/0091978 | A1 | 5/2006 | Wang et al. |
| 2008/0007369 | A1 | 1/2008 | Barber et al. |
| 2008/0297278 | A1 | 12/2008 | Handtmann et al. |
| 2009/0096549 | A1 | 4/2009 | Thalhammer et al. |
| 2009/0096550 | A1 | 4/2009 | Handtmann et al. |
| 2010/0277237 | A1 | 11/2010 | Sinha et al. |
| 2011/0115334 | A1 | 5/2011 | Konishi et al. |
| 2011/0121689 | A1 | 5/2011 | Grannen et al. |
| 2011/0210787 | A1 | 9/2011 | Lee et al. |
| 2012/0007696 | A1 | 1/2012 | Pang et al. |
| 2012/0187799 | A1 | 7/2012 | Nakahashi |
| 2012/0313725 | A1 | 12/2012 | Ueda et al. |
| 2013/0033150 | A1 | 2/2013 | Bardong et al. |
| 2013/0113576 | A1 | 5/2013 | Inoue et al. |
| 2013/0193808 | A1 | 8/2013 | Feng et al. |
| 2014/0132117 | A1 | 5/2014 | Larson, III |
| 2014/0145557 | A1 | 5/2014 | Tanaka |
| 2014/0167565 | A1 | 6/2014 | Iwamoto |
| 2015/0222246 | A1 | 8/2015 | Nosaka |
| 2015/0280100 | A1 | 10/2015 | Burak et al. |
| 2015/0369153 | A1 | 12/2015 | Tsunooka et al. |
| 2016/0028364 | A1 | 1/2016 | Takeuchi |
| 2016/0056789 | A1 | 2/2016 | Otsubo et al. |
| 2016/0191012 | A1 | 6/2016 | Khlat et al. |
| 2016/0191014 | A1 | 6/2016 | Khlat et al. |
| 2016/0191016 | A1 | 6/2016 | Khlat et al. |
| 2016/0261235 | A1 | 9/2016 | Ortiz |
| 2016/0268998 | A1 | 9/2016 | Xu et al. |
| 2016/0308576 | A1 | 10/2016 | Khlat et al. |
| 2016/0359468 | A1 | 12/2016 | Taniguchi et al. |
| 2017/0093369 | A1 | 3/2017 | Khlat et al. |
| 2017/0093370 | A1 | 3/2017 | Khlat et al. |
| 2017/0141757 | A1 | 5/2017 | Schmidhammer |
| 2017/0201233 | A1 | 7/2017 | Khlat |
| 2017/0301992 | A1 | 10/2017 | Khlat et al. |
| 2017/0324159 | A1 | 11/2017 | Khlat |
| 2017/0338795 | A1 | 11/2017 | Nakagawa et al. |
| 2018/0013402 | A1 | 1/2018 | Kirkpatrick et al. |
| 2018/0041191 | A1 | 2/2018 | Park |
| 2018/0076793 | A1 | 3/2018 | Khlat et al. |
| 2018/0076794 | A1 | 3/2018 | Khlat et al. |
| 2018/0109236 | A1 | 4/2018 | Konoma |
| 2018/0109237 | A1 | 4/2018 | Wasilik et al. |
| 2018/0145658 | A1 | 5/2018 | Saji |
| 2018/0219530 | A1 | 8/2018 | Khlat et al. |
| 2018/0241418 | A1 | 8/2018 | Takamine et al. |
| 2019/0140618 | A1 | 5/2019 | Takamine |
| 2019/0199320 | A1 | 6/2019 | Morita et al. |
| 2019/0207583 | A1 | 7/2019 | Miura et al. |
| 2019/0222197 | A1 | 7/2019 | Khlat et al. |
| 2019/0288664 | A1 | 9/2019 | Saji |
| 2019/0305752 | A1 | 10/2019 | Sadhu et al. |

OTHER PUBLICATIONS

Larson, John, et al., "Characterization of Reversed c-axis AlN Thin Films," International Ultrasonics Symposium Proceedings, 2010, IEEE, pp. 1054-1059.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Notice of Allowance for U.S. Appl. No. 15/586,374, dated Oct. 4, 2019, 7 pages.
Notice of Allowance for U.S. Appl. No. 15/644,922, dated Oct. 21, 2019, 10 pages.
Non-Final Office Action for U.S. Appl. No. 15/883,933, dated Oct. 25, 2019, 19 pages.
Final Office Action for U.S. Appl. No. 15/697,658, dated Oct. 22, 2019, 9 pages.
Non-Final Office Action for U.S. Appl. No. 14/757,587, dated Sep. 13, 2016, 12 pages.
Notice of Allowance for U.S. Appl. No. 14/757,587, dated Mar. 9, 2017, 8 pages.
Non-Final Office Action for U.S. Appl. No. 15/004,084, dated Jun. 12, 2017, 9 pages.
Non-Final Office Action for U.S. Appl. No. 14/757,651, dated Jun. 9, 2017, 11 pages.
Non-Final Office Action for U.S. Appl. No. 15/275,957, dated Jun. 14, 2017, 9 pages.
Ex Parte Quayle Action for U.S. Appl. No. 15/347,452, dated Jun. 15, 2017, 7 pages.
Final Office Action for U.S. Appl. No. 15/275,957, dated Jan. 2, 2018, 7 pages.

(56) References Cited

OTHER PUBLICATIONS

Author Unknown, "SAW Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.
Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Capilla, Jose et al., "High-Acoustic-Impedence Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.
Fattinger, Gernot et al., ""Single-to-balanced Filters for Mobile Phones using Coupled Resonator BAW Technology,"" 2004 IEEE International Ultrasonics, Ferroelectrics,and Frequency Control Joint 50th Anniversary Conference, Aug. 23-27, 2004, IEEE, pp. 416-419.
Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarish et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/290,175, dated Apr. 14, 2020, 29 pages.
Final Office Action for U.S. Appl. No. 15/883,933, dated Oct. 23, 2020, 15 pages.
Final Office Action for U.S. Appl. No. 16/290,175, dated Sep. 17, 2020, 13 pages.

FILTER CIRCUITS HAVING ACOUSTIC WAVE RESONATORS IN A TRANSVERSAL CONFIGURATION

RELATED APPLICATIONS

This application claims the benefit of provisional patent application Ser. No. 62/516,725, filed Jun. 8, 2017, the disclosure of which is hereby incorporated herein by reference in its entirety.

FIELD OF THE DISCLOSURE

The technology of the disclosure relates generally to electronic filtering circuits, and more particularly to filter circuits with acoustic wave resonators.

BACKGROUND

Electronic filter circuits perform signal processing functions in communications systems, such as removal of undesired frequency components or enhancement of desired frequency components from communications signals. Increasing mobile devices in communications systems demands filter circuits having reduced sizes and stringent filtering responses. For filter circuits with acoustic wave resonators, filter performance is strongly related to the filter topology, that is, the way the resonators are arranged along the filter configuration. Even more stringent filtering requirements are foreseen for future communications systems.

Filter circuit structures based on bulk acoustic wave (BAW) or surface acoustic wave (SAW) resonators are classified as ladder configurations, lattice configurations, and acoustically coupled resonators. A ladder filter configuration consists of arranging BAW or SAW resonators following a well-known ladder topology. In a bandpass filter performance, series resonators define an upper band of the filter, whereas shunt resonators define a lower band. Constraints of the ladder configuration are the achievable bandwidth, strongly related to the coupling coefficient of the piezoelectric material, and the predefined position of the transmission zeros.

A lattice filter configuration consists of cascading single stages of a lattice bridge circuit formed by four BAW or SAW resonators. The lattice configuration is suitable for balanced networks. In contrast with the ladder filter configuration, a filter bandwidth (e.g., the upper and/or lower band of the filter) of the lattice filter configuration does not depend on the coupling coefficient of the resonator or the position of transmission zeros. Instead, filter response can be synthesized by the balance degree of each single stage of the lattice filter configuration. For instance, when a perfect balance exists (e.g., when all resonators in the stage have the same intrinsic capacitance) the filter response does not exhibit any transmission zero.

A coupled resonator filter configuration consists of a filter topology on which individual acoustic wave resonators (BAW or SAW) are acoustically coupled. In BAW resonators, the coupled resonator configuration requires additional layers to create the acoustic coupling and to stack a piezoelectric layer for each resonator. Coupled resonator filters are readily available in SAW technology.

Therefore, a filter configuration with improved performance and capability to provide filter responses not currently achievable with existing filter configurations can accelerate the implementation of future communication systems and ensure the steady use of BAW and SAW technology as the preferred technology in portable devices.

SUMMARY

Exemplary aspects of the present disclosure relate to filter circuits having acoustic wave resonators in a transversal configuration. In the transversal configuration, the acoustic wave resonators are arranged transverse to an input and output port (e.g., a first circuit node and a second circuit node) of the filter circuit. As such, all the acoustic wave resonators of the filter circuit are electrically connected to the input port and electrically connected to the output port. In the transversal configuration, the filter circuit can be designed for any transfer function without being restricted to a coupling coefficient of a piezoelectric material used in the acoustic wave resonators. In this regard, the filter circuit can achieve very wideband filter responses, multiband responses, and/or responses with arbitrary position of transmission zeros. The filter circuit having the transversal configuration can also be designed for complex transmission zeros for phase equalization.

Filter circuits according to the present disclosure can implement the transversal filter configuration with conventional acoustic wave resonator topologies, including surface acoustic wave (SAW) resonators and bulk acoustic wave (BAW) resonators. The individual BAW and/or SAW resonators can be arranged to create a frequency-selective filter response. The selection of resonator topology can affect the filter size, electrical performance, and design procedure.

Filter circuits having acoustic wave resonators in a transversal configuration can additionally have a reduced number of connecting points as compared with other filter configurations. This may in turn enable an achievable degree of miniaturization, allow for the use of very few external components to provide trimming, and provide tunable capabilities to the filtering structure. A synthesis procedure used to obtain filter configurations according to aspects disclosed herein allows several transversal configurations with a single response. Selection of the most convenient topology can then be decided according to manufacturing concerns, areas of the resonators, resonant frequencies, and/or nonlinear performance. Moreover, the transversal configuration allows a direct synthesis of a filter circuit from a mathematical description of a polynomial transfer function.

In an exemplary aspect, a filter circuit is provided. The filter circuit includes a first circuit port and a second circuit port. A first filter branch is connected between the first circuit port and the second circuit port and comprises a first acoustic wave resonator transverse to the first circuit port and the second circuit port. A second filter branch is connected between the first circuit port and the second circuit port and comprises a second acoustic wave resonator transverse to the first circuit port and the second circuit port. The second filter branch has a phase shift from the first filter branch.

In another exemplary aspect, a filter circuit is provided. The filter circuit includes a first circuit port and a first filter branch connected between the first circuit port and a first differential node. The first filter branch comprises a first plurality of parallel acoustic wave resonators. The filter circuit also includes a second filter branch connected between the first circuit port and a second differential node. The second filter branch comprises at least one acoustic wave resonator.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
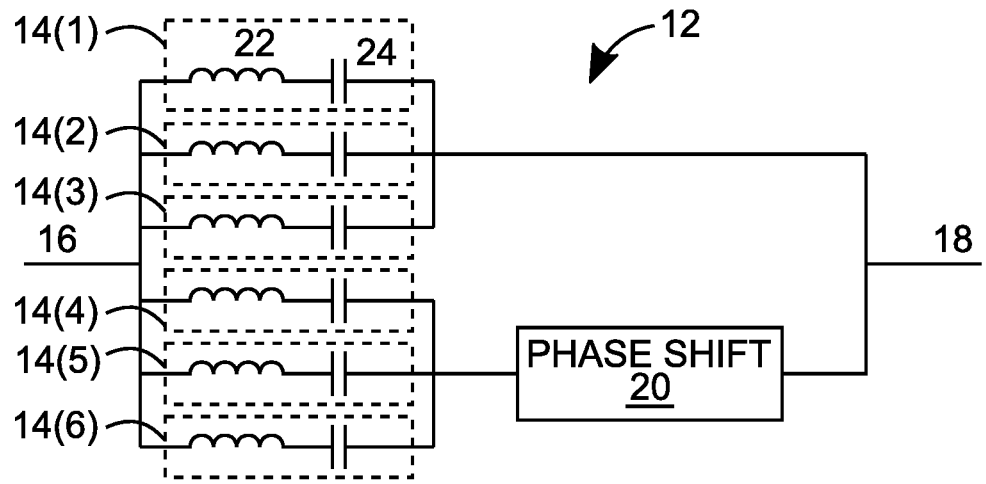
FIG. 1 depicts an exemplary schematic diagram of a filter circuit having inductor-capacitor (LC) series conventional resonators in a transversal configuration.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" to another element, it can be directly connected to the other element or intervening elements may be present. In contrast, when an element is referred to as being "directly connected" to another element, there are no intervening elements present. Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Exemplary aspects of the present disclosure relate to filter circuits having acoustic wave resonators in a transversal configuration. In a transversal configuration, the acoustic wave resonators are arranged transverse to an input and output port (e.g., a first circuit node and a second circuit node) of the filter circuit. As such, all the acoustic wave resonators of the filter circuit are electrically connected to the input port and electrically connected to the output port. In the transversal configuration, the filter circuit can be designed for any transfer function without being restricted to a coupling coefficient of a piezoelectric material used in the acoustic wave resonators. In this regard, the filter circuit can achieve very wideband filter responses, multiband responses, and/or responses with arbitrary position of transmission zeros. The filter circuit having the transversal configuration can also be designed for complex transmission zeros for phase equalization.

Filter circuits according to the present disclosure can implement the transversal filter configuration with conventional acoustic wave resonator topologies, including surface acoustic wave (SAW) resonators and bulk acoustic wave (BAW) resonators. The individual BAW and/or SAW resonators can be arranged to create a frequency-selective filter response. The selection of resonator topology can affect the filter size, electrical performance, and design procedure.

Filter circuits having acoustic wave resonators in a transversal configuration can additionally have a reduced number of connecting points as compared with other filter configurations. This may in turn enable an achievable degree of miniaturization, allow for the use of very few external components to provide trimming, and provide tunable capabilities to the filtering structure. The synthesis procedure used to obtain filter configurations according to aspects disclosed herein allows several transversal configurations with a single response. Selection of the most convenient topology can then be decided according to manufacturing concerns, areas of the resonators, resonant frequencies, and/or nonlinear performance. Moreover, the transversal configuration allows a direct synthesis of a filter circuit from a mathematical description of a polynomial transfer function.

FIG. 1 depicts an exemplary schematic diagram of a filter circuit 12 having inductor-capacitor (LC) series conventional resonators 14(1)-14(6) in a transversal configuration. In the transversal configuration depicted in FIG. 1, each of the conventional resonators 14(1)-14(6) is electrically connected (e.g., directly connected) from a first circuit port 16 to a second circuit port 18. The first circuit port 16 and the second circuit port 18 correspond to an input and output port of the filter circuit 12, respectively, or vice versa. Some of the conventional resonators 14(1)-14(6) are connected between the first circuit port 16 and the second circuit port 18 through a phase shift circuit 20, which can provide or cause a 180 degree phase shift (which in some cases may be between 160 degrees and 200 degrees).

The filter circuit 12 of FIG. 1 is a sixth order filter, having six conventional resonators 14(1)-14(6). Three of the conventional resonators 14(4)-14(6) are connected in parallel and connected (e.g., directly connected) to the phase shift circuit 20, while the other three conventional resonators 14(1)-14(3) are connected in parallel without the phase shift circuit 20. Parameters of the conventional resonators 14(1)-14(6), such as impedance and resonant frequency, are defined by a respective series inductance 22 and a capacitance 24 according to a desired frequency response for the filter circuit 12.

In this regard, the filter circuit 12 can be designed by a synthesis procedure which begins with proposing a mathematical description of a desired response of the filter circuit 12 based on known characteristic polynomials. The characteristic polynomials are used to obtain a two-port admittance Y-parameters matrix (e.g., with the two ports being the first circuit port 16 and the second circuit port 18). Partial polynomial expansion can be applied to the rational functions defining the terms of the two-port Y matrix. The expansion results in a new two-port Y matrix where each term can be expressed as a summation of first order rational functions. Each first order rational matrix corresponds to a conventional resonator 14(1)-14(6) with a single pole and without a zero. Thus the values of the resonant frequency and impedance of each conventional resonator 14(1)-14(6) are set by the synthesis procedure, and defined by the respective series inductance 22 and the capacitance 24 of the conventional resonators 14(1)-14(6). The response of the filter circuit 12 (e.g., both in-band and out-of-band response), including transmission zeros, is created by the contribution of signals through each conventional resonator 14(1)-14(6).

This synthesis procedure, implemented through the transversal configuration of the conventional resonators 14(1)-14(6) can be applied to any type of filter response. For example, a filter circuit 12 with the transversal configuration can achieve very wideband responses, multiband responses, responses with arbitrary position of the transmission zeros, and responses with complex transmission zeros for phase equalization requirements. This facilitates using acoustic wave filters based on transversal configurations in many applications and novel system architectures, such as further depicted in FIGS. 2-7.

Figure 2:
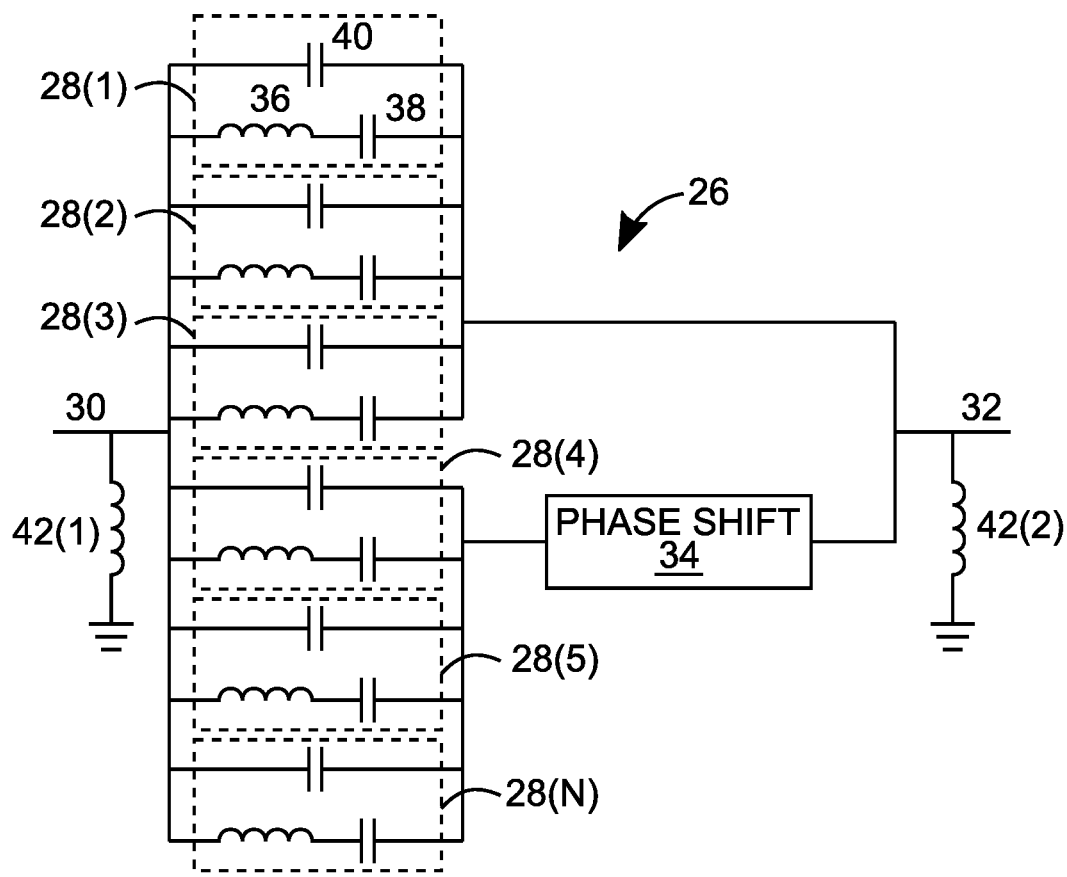
FIG. 2 depicts an exemplary schematic diagram of a filter circuit having acoustic wave resonators in a transversal configuration, illustrating a Butterworth-Van Dyke (BVD)-equivalent circuit for the acoustic wave resonators.

FIG. 2 depicts an exemplary schematic diagram of a filter circuit 26 having acoustic wave resonators 28(1)-28(N) in a transversal configuration, illustrating a Butterworth-Van Dyke (BVD)-equivalent circuit for the acoustic wave resonators 28(1)-28(N). Similar to the transversal configuration depicted in FIG. 1, each of the acoustic wave resonators 28(1)-28(N) is electrically connected from a first circuit port 30 to a second circuit port 32. The first circuit port 30 and the second circuit port 32 correspond to an input and output port of the filter circuit 26, respectively, or vice versa. Some of the acoustic wave resonators 28(1)-28(N) are connected between the first circuit port 30 and the second circuit port 32 through a phase shift circuit 34, which can cause or provide a 180 degree phase shift (which in some cases may be between 160 degrees and 200 degrees).

The filter circuit 26 of FIG. 2 can be a second order or higher filter having N acoustic wave resonators 28(1)-28(N) to give an N-order filter (e.g., illustrated as a sixth order filter with six acoustic wave resonators 28(1)-28(N)). As indicated in FIG. 2, half of the acoustic wave resonators 28(1)-28(N) (or half−1 or half+1 in an odd order filter) need to be phase shifted 180 degrees before connecting them to the second circuit port 32, and are accordingly connected in parallel and electrically connected (e.g., directly connected) to the phase shift circuit 34. The remaining acoustic wave resonators 28(1)-28(N) are connected in parallel without the phase shift circuit 34 (e.g., directly connected to the first circuit port 30 and the second circuit port 32). The values of the acoustic resonance of each acoustic wave resonator 28(1)-28(N) are defined by using filter synthesis techniques, as described above with respect to FIG. 1. In an exemplary aspect, each acoustic wave resonator 28(1)-28(N) contributes a different resonance value to shape the transfer function of the filter circuit 26.

The acoustic wave resonators 28(1)-28(N) can be any appropriate acoustic wave resonator, such as SAW or BAW resonators. The parameters of the acoustic wave resonators 28(1)-28(N), such as impedance and resonant frequency, are defined by a respective series inductance 36 and a capacitance 38, for each acoustic wave resonator 28(1)-28(N). Thus, the respective series inductance 36 and the capacitance 38 of each acoustic wave resonator 28(1)-28(N) can be selected according to a desired frequency response for the filter circuit 26 and the synthesis procedure described with respect to FIG. 1.

Each acoustic wave resonator 28(1)-28(N) can be defined through the BVD-equivalent circuit depicted in FIG. 2, including the respective series inductance 36 and capacitance 38, as well as a respective intrinsic capacitance 40. As a result, each acoustic wave resonator 28(1)-28(N) has a pole and a zero. However, the response of the filter circuit 26 is not modified by the respective intrinsic capacitance 40 of the acoustic wave resonators 28(1)-28(N) if the respective intrinsic capacitance 40 is compensated adequately. The necessary compensation can be mathematically obtained from the initially synthesized values of the respective series inductance 36 and the capacitance 38 and a desired acoustic coupling coefficient. The compensation is achieved by the different paths of the acoustic wave resonators 28(1)-28(N) followed by a signal processed through the filter circuit 26. One or more shunt inductances 42(1), 42(2) can be included at the first circuit port 30 and/or the second circuit port 32 in order to facilitate in-band impedance matching. Values of the shunt inductances 42(1), 42(2) can be selected based on the respective intrinsic capacitances 40 of the acoustic wave resonators 28(1)-28(N).

Figure 3:
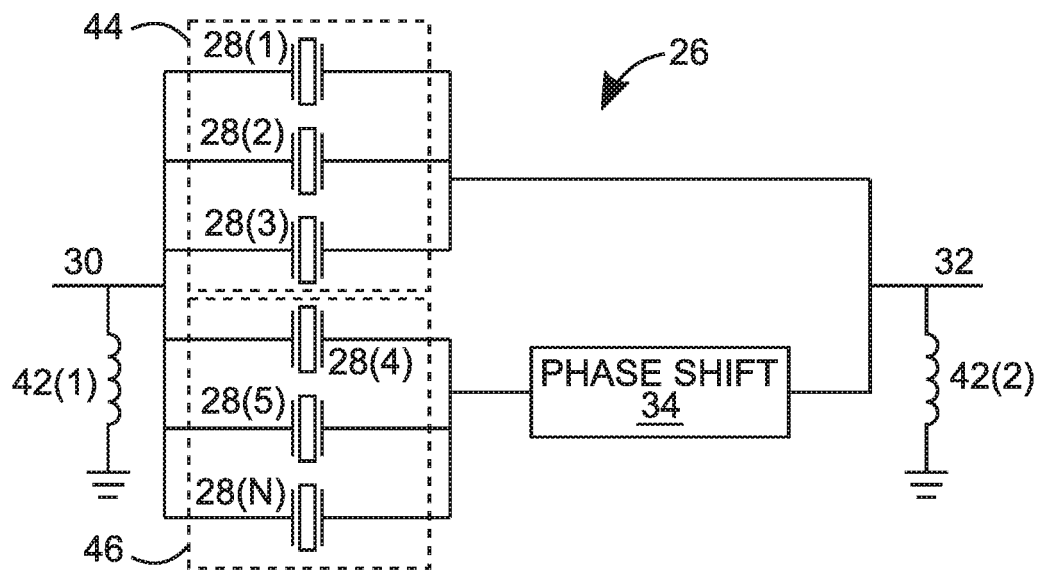
FIG. 3 depicts another exemplary schematic diagram of the filter circuit of FIG. 2, illustrating a symbolic representation of the acoustic wave resonators in a first filter branch and a second filter branch.

FIG. 3 depicts another exemplary schematic diagram of the filter circuit 26 of FIG. 2, illustrating a symbolic representation of the acoustic wave resonators 28(1)-28(N) in a first filter branch 44 (e.g., an upper filter branch) and a second filter branch 46 (e.g., a lower filter branch). The filter circuit 26 depicted in FIG. 3 can be equivalent to the filter circuit 26 in FIG. 2, and the acoustic wave resonators 28(1)-28(N) of FIG. 3 can be characterized by the BVD-equivalent circuit for each acoustic wave resonator 28(1)-28(N) of FIG. 2.

As indicated in FIG. 3, the first filter branch 44 includes half of the acoustic wave resonators 28(1)-28(N) (or half−1 or half+1 in an odd order filter) in a transversal configuration connected from the first circuit port 30 to the second circuit port 32. The second filter branch 46 includes the remaining acoustic wave resonators 28(1)-28(N) in a transversal configuration connected from the first circuit port 30 to the second circuit port 32. The second filter branch 46 is phase shifted through the phase shift circuit 34 (e.g., which may be configured to cause the phase of signals in the second filter branch 46 to shift by 180 degrees, or between 160 degrees and 200 degrees relative to the first filter branch 44) before being connected to the second circuit port 32. In an exemplary aspect, each of the first filter branch 44 and the second filter branch 46 includes one or a plurality of acoustic wave resonators 28(1)-28(N). The values of the acoustic resonance of each acoustic wave resonator 28(1)-28(N) are defined by using filter synthesis techniques, as described above with respect to FIGS. 1 and 2. The first inductance 42(1) can be connected in shunt with the first circuit port 30, and the second inductance 42(2) can be connected in shunt with the second circuit port 32.

Referring to FIGS. 2 and 3, the value of the respective intrinsic capacitance 40 sets the position of the parallel resonance of each acoustic wave resonator 28(1)-28(N) and its area. Due to flexibility on selecting the respective intrinsic capacitance 40 value, the filter circuit 26 can have a desired coupling coefficient for any type of response. Close form expressions can be defined to obtain the required respective intrinsic capacitance 40 value of each path to give the desired coupling coefficient of each acoustic wave resonator 28(1)-28(N). Therefore, using the transversal configuration any transfer function can be achieved for the filter circuit 26 by using the desired coupling coefficient.

Figure 4:
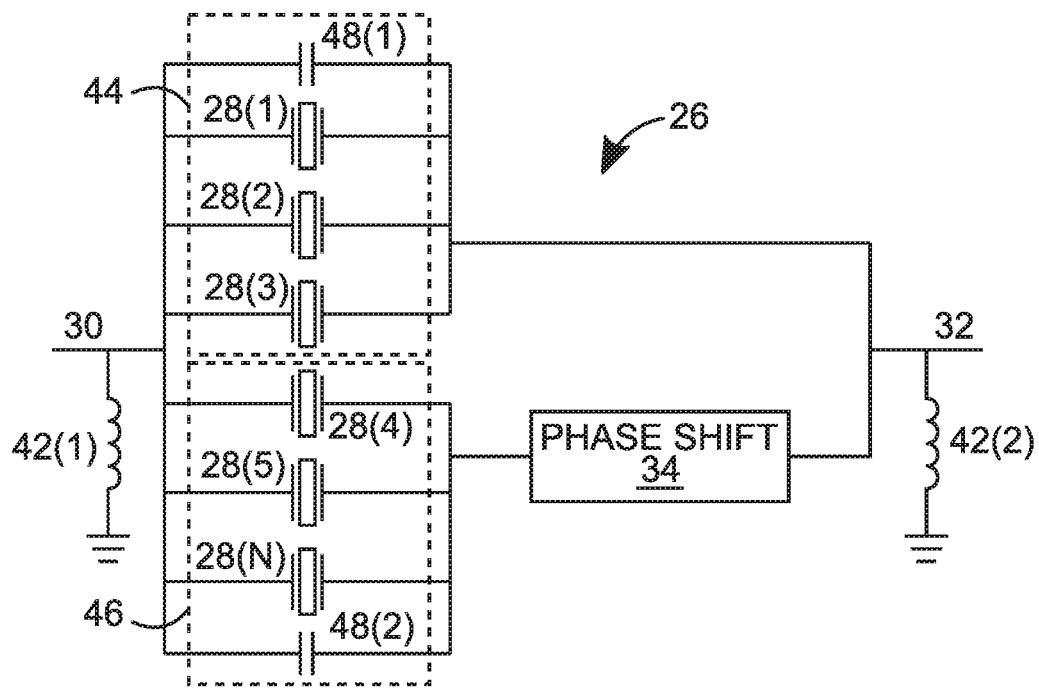
FIG. 4 depicts another exemplary schematic diagram of the filter circuit of FIG. 3, illustrating external capacitances connected to one or more of the first filter branch and the second filter branch.

Additional capacitance might be added in the filter circuit 26 of FIG. 3. FIG. 4 depicts another exemplary schematic diagram of the filter circuit 26 of FIG. 3, illustrating external capacitances 48(1), 48(2) connected to one or more of the first filter branch 44 and the second filter branch 46. The first external capacitance 48(1) is connected in a transversal manner parallel to the first filter branch 44 (e.g., the acoustic wave resonators 28(1)-28(N) that do not go through the phase shift circuit 34). The second external capacitance 48(2) is connected in a transversal manner with the second filter branch 46 (e.g., the acoustic wave resonators 28(1)-28(N) that go through the phase shift circuit 34). With the inclusion of the external capacitances 48(1), 48(2) the signal path through the filter circuit 26 can be accordingly tailored and the position of out of band transmission zeros can be trimmed or tuned. The values of the shunt inductances 42(1), 42(2) can be selected based on the external capacitances 48(1), 48(2) in addition to the respective intrinsic capacitance 40 of the acoustic wave resonators 28(1)-28(N).

Figure 5:
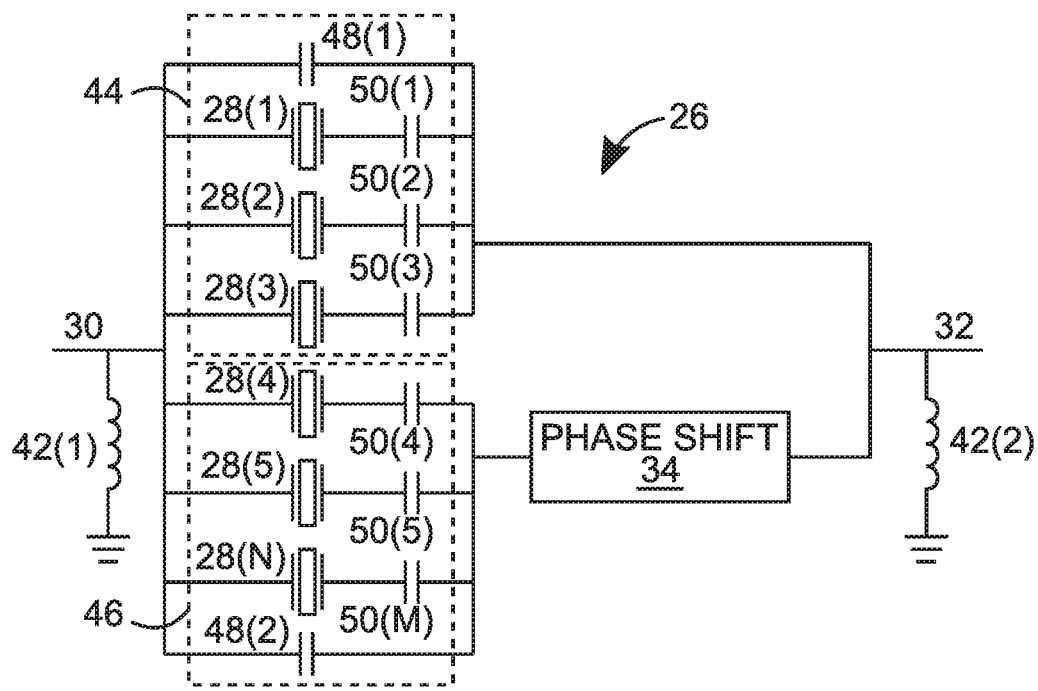
FIG. 5 depicts another exemplary schematic diagram of the filter circuit of FIGS. 3 and/or 4, illustrating series capacitances connected to one or more of the acoustic wave resonators.

FIG. 5 depicts another exemplary schematic diagram of the filter circuit 26 of FIGS. 3 and/or 4, illustrating series capacitances 50(1)-50(M) connected to one or more of the acoustic wave resonators 28(1)-28(N). In order to include further flexibility in the selection of the acoustic wave resonators 28(1)-28(N) forming the transversal filter circuit 26 of FIG. 3 and FIG. 4, an additional series capacitance 50(1)-50(M) can be connected in series with one or more of the acoustic wave resonators 28(1)-28(N). In some examples, each acoustic wave resonator 28(1)-28(N) is connected to a corresponding series capacitance 50(1)-50(M). The addition of series capacitances can result in flexibility in the selection of the series resonance and impedance of each acoustic wave resonator 28(1)-28(N). The overall series resonance of each acoustic wave resonator 28(1)-28(N) (e.g., circuit path) fulfills the initial synthesized value according to the synthesis procedure describe above.

Figure 6:
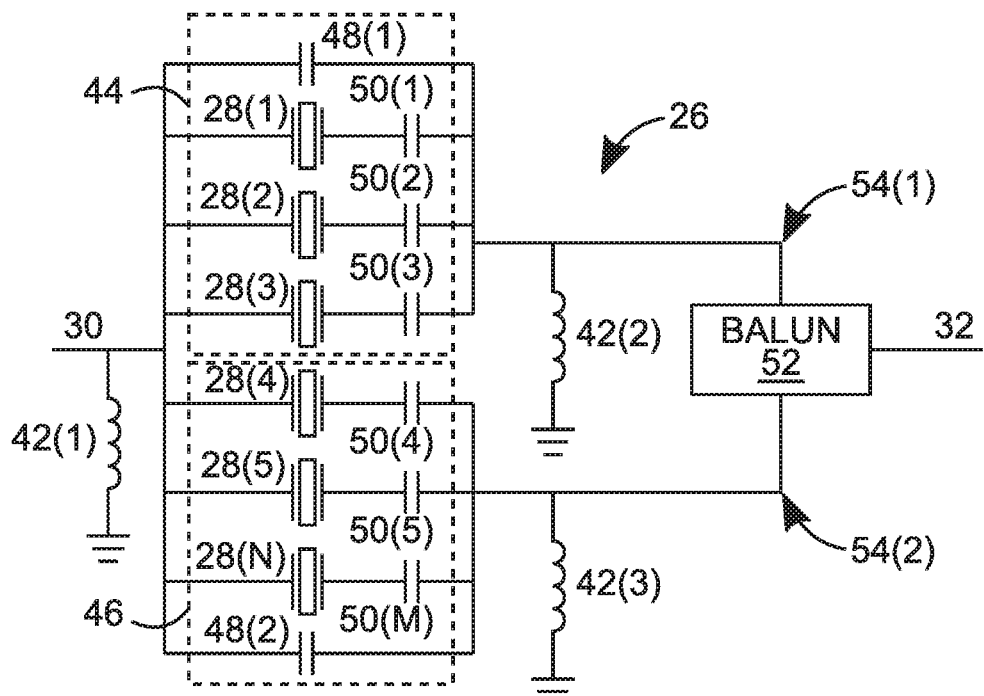
FIG. 6 depicts another exemplary schematic diagram of the filter circuit, illustrating a balun circuit in place of the phase shift circuit of FIGS. 2-5.

FIG. 6 depicts another exemplary schematic diagram of the filter circuit 26, illustrating a balun circuit 52 in place of the phase shift circuit 34 of FIGS. 2-5. The phase shift (e.g., a 180 degree phase shift) for the acoustic wave resonators 28(1)-28(N) in the second filter branch 46 can be achieved by the use of the balun circuit 52 at one end of the filter circuit 26. In this regard, the balun circuit 52 (e.g., a balanced-unbalanced stage) can be connected (e.g., directly connected) to each of the first filter branch 44, the second filter branch 46, and the second circuit port 32.

For example, the first filter branch 44 can be connected to a first differential node 54(1) and the second filter branch 46 can be connected to a corresponding, second differential node 54(2). The balun circuit 52 can be connected between the differential nodes 54(1), 54(2) and the second circuit port 32, converting between a balanced signal (e.g., at the differential nodes 54(1), 54(2)) and an unbalanced signal (e.g., at the second circuit port 32). In an exemplary aspect, the first shunt inductance 42(1) is connected to the first circuit port 30, while the second shunt inductance 42(2) is connected to the first differential node 54(1) and a third shunt inductance 42(3) is connected to the second differential node 54(2).

Figure 7:
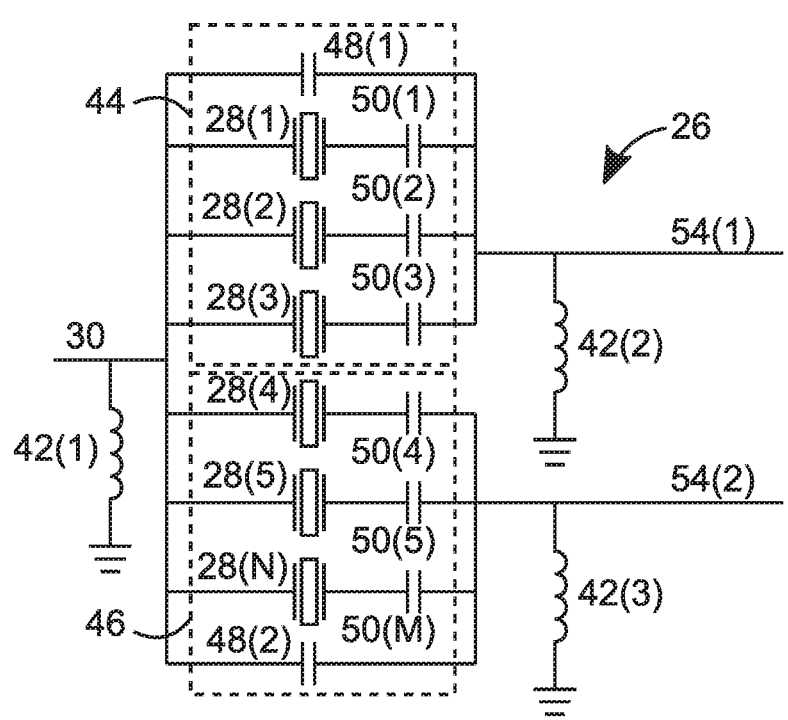
FIG. 7 depicts another exemplary schematic diagram of the filter circuit, illustrating a single circuit port (e.g., input/output port) at one end of the filter circuit and a first differential node and a second differential node (e.g., a differential input/output port) at another end of the filter circuit.

The transversal configuration of the filter circuit 26 can also provide a differential output (or differential input), as indicated in FIG. 7. FIG. 7 depicts another exemplary schematic diagram of the filter circuit 26, illustrating a single circuit port 30 (e.g., input/output port) at one end of the filter circuit 26 and the first differential node 54(1) and the second differential node 54(2) (e.g., a differential input/output port) at another end of the filter circuit 26. In some examples, the first differential node 54(1) and the second differential node 54(2) can be an input or output port which is connected to integrated circuit (IC) components, such as for additional processing.

In other examples, each of the exemplary filter circuits 26 of FIGS. 2-5 can be considered as having the first differential node 54(1) connected to the first filter branch 44 (e.g., the acoustic wave resonators 28(1)-28(N) that do not go through the phase shift circuit 34) and the second differential node 54(2) connected to the second filter branch 46 (e.g., the acoustic wave resonators 28(1)-28(N) that go through the phase shift circuit 34). In these examples, the phase shift circuit 34 can be connected between the second differential node 54(2) and the second circuit port 32, and the first differential node 54(1) can be connected to the second circuit port 32.

Referring to FIGS. 2-7, by making adjustable or tunable external elements (e.g., external capacitances 48(1), 48(2), series capacitances 50(1)-50(M), and/or shunt inductances 42(1)-42(3)) in the transverse configuration of the filter circuit 26, the frequency response of the filter circuit 26 can be modified to improve its performance, to compensate thermal effects, and/or to achieve tunable acoustic filter responses. In addition, due to the flexibility in selecting BAW resonators, SAW resonators, and/or additional parameters of the acoustic wave resonators 28(1)-28(N), the filter circuit 26 can have an improved nonlinear response. For example, with the filter circuit 26 disclosed herein the area and resonant frequencies of the acoustic wave resonators 28(1)-28(N) can be controlled, and thereby the contribution of each acoustic wave resonator 28(1)-28(N) into a certain bandwidth can be controlled.

An additional benefit of aspects of the transversal configuration of the filter circuit 26 disclosed herein is that any acoustic wave resonator 28(1)-28(N) can be accessed by the same pins (e.g., the first circuit port 30 and the second circuit port 32 or the first circuit port 30 and the first and second differential nodes 54(1), 54(2)). This may facilitate miniaturization of the final packaging of the filter circuit 26 and/or other components with which the filter circuit 26 may be packaged.

As described above, the proposed transversal configuration of the filter circuit 26 of FIGS. 2-7 offers the possibility of creating any type of filter response, including very wideband responses, multiband responses, responses with arbitrary position of transmission zeros, and/or responses with complex transmission zeros. Moreover, the various filter responses can be achieved by proposing in advance coupling coefficients of the acoustic wave resonators 28(1)-28(N) to be used, facilitating flexibility on the selection of the series resonances and impedances of the acoustic wave resonators 28(1)-28(N). In this manner, filter circuits 26 implementing acoustic wave resonators 28(1)-28(N) can be used in many applications not feasible with traditional filter configurations.

Figure 8:
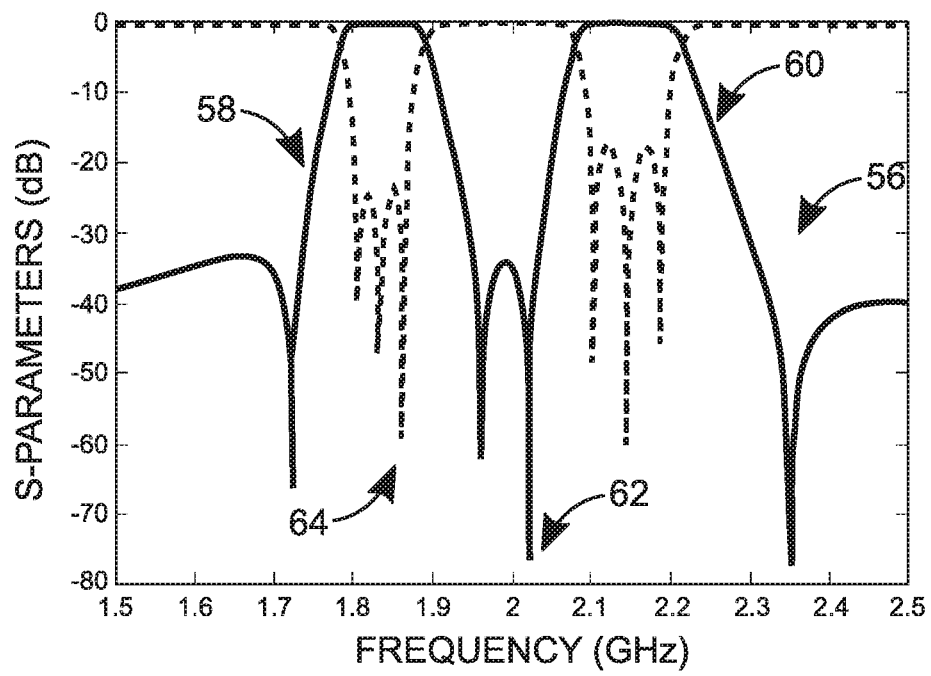
FIG. 8 depicts a graphical representation of an exemplary filter response of the filter circuit depicted in any of FIGS. 2-7.
Figure 9:
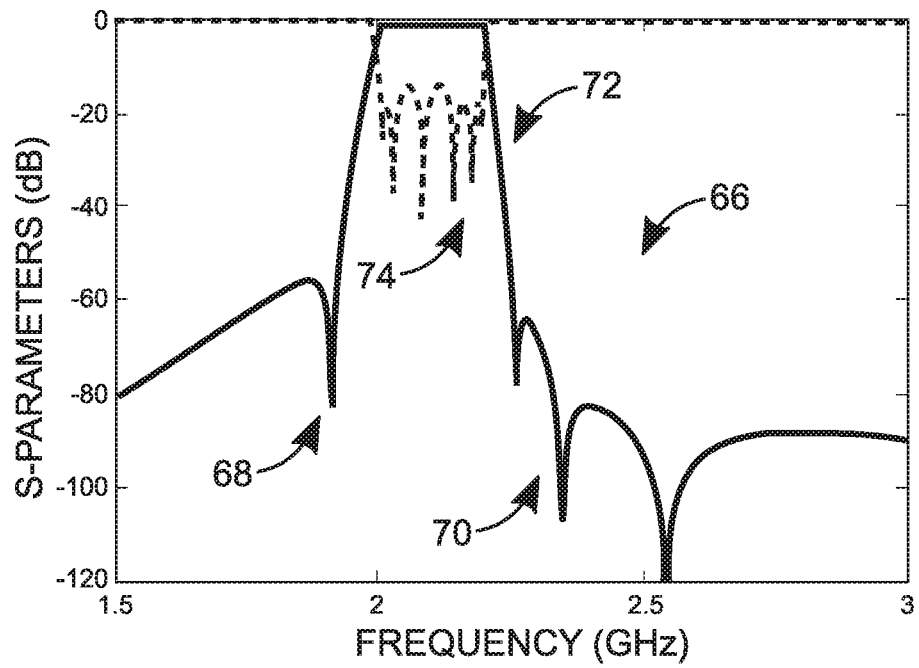
FIG. 9 depicts a graphical representation of another exemplary filter response of the filter circuit depicted in any of FIGS. 2-7.

With the flexibility provided by the transversal configuration in the filter circuit 26 of FIGS. 2-7, a given filter response, such as depicted in FIG. 8 or FIG. 9, can be synthesized with:
  i) predefined values of coupling coefficients of the acoustic wave resonators 28(1)-28(N) without any external element (e.g., without the external capacitances 48(1), 48(2) or the series capacitances 50(1)-50(M));
  ii) predefined values of the coupling coefficients of the acoustic wave resonators 28(1)-28(N) and a predefined value of the impedance (e.g., area) of the acoustic wave resonators 28(1)-28(N);
  iii) predefined values of the coupling coefficients of the acoustic wave resonators 28(1)-28(N) and predefined values of series resonant frequencies of the acoustic wave resonators 28(1)-28(N); and/or
  iv) predefined values of the coupling coefficients of the acoustic wave resonators 28(1)-28(N) and a range of suitable values on the impedance (e.g., area) of the acoustic wave resonators 28(1)-28(N) and selected groups of series resonant frequencies of the acoustic wave resonators 28(1)-28(N).

Illustrative examples of the type of responses achievable with the filter circuit 26 of FIGS. 2-7 are shown in FIG. 8 and FIG. 9. FIG. 8 depicts a graphical representation of an exemplary filter response 56 of the filter circuit 26 depicted in any of FIGS. 2-7. In the filter response 56 illustrated in FIG. 8, a sixth order dual-band filter circuit 26 is synthesized with acoustic wave filters 28(1)-28(N) in a transversal configuration. The overall bandwidth of the dual-band filter response 56 is covering up to 400 MHz at a 2 GHz center frequency. The dual-band filter response 56 includes a first pass band 58 and a second pass band 60. The filter response 56 also includes a number of transmission zeros 62. A return loss 64 (e.g., depicted as a dashed line) indicates transmission poles.

In the example illustrated in FIG. 8, all the acoustic wave resonators 28(1)-28(N) forming the filter circuit 26 have a 6.8% coupling coefficient. The illustrated filter response 56 can be obtained with acoustic wave resonators 28(1)-28(N) with a predefined impedance or predefined series resonant frequency.

FIG. 9 depicts a graphical representation of another exemplary filter response 66 of the filter circuit 26 depicted in any of FIGS. 2-7. In the filter response 66 illustrated in FIG. 9, a sixth order filter circuit 26 having a wideband response and asymmetric locations of transmission zeros 68, 70 is synthesized with acoustic wave filters 28(1)-28(N) in a transversal configuration. The filter response 66 includes a pass band 72, having three transmission zeros 70 at an upper side band and one transmission zero 68 at a lower side band. A return loss 74 (e.g., depicted as a dashed line) indicates transmission poles. Similar to FIG. 8, all the acoustic wave resonators 28(1)-28(N) forming the filter circuit 26 of FIG. 9 have a 6.8% coupling coefficient. The filter response 66 can also be obtained with acoustic wave resonators 28(1)-28(N) with a predefined impedance or predefined series resonant frequency Those skilled in the art will recognize improvements and modifications to the preferred embodiments of the present disclosure. All such improvements and modifications are considered within the scope of the concepts disclosed herein and the claims that follow.

What is claimed is:

1. A filter circuit, comprising:
   a first circuit port;
   a second circuit port;
   a first filter branch connected between the first circuit port and the second circuit port and comprising a first acoustic wave resonator transverse to the first circuit port and the second circuit port;
   a second filter branch connected between the first circuit port and the second circuit port and comprising a second acoustic wave resonator transverse to the first circuit port and the second circuit port; and
   a balun circuit connected between the second filter branch and the second circuit port and connected between the first filter branch and the second circuit port;
   such that the second filter branch has a phase shift from the first filter branch.

2. The filter circuit of claim 1, wherein the first filter branch comprises a first plurality of parallel acoustic wave resonators.

3. The filter circuit of claim 2, further comprising a plurality of series capacitances, each connected in series with a respective parallel acoustic wave resonator of the first plurality of parallel acoustic wave resonators.

4. The filter circuit of claim 2, wherein the second filter branch comprises a second plurality of parallel acoustic wave resonators.

5. The filter circuit of claim 1, further comprising:
   an impedance matching network connected in shunt with at least one of the first circuit port or the second circuit port.

6. The filter circuit of claim 1, further comprising:
   a first shunt inductance connected to the first circuit port; and a second shunt inductance connected to the second circuit port;
wherein the first shunt inductance and the second shunt inductance are based on an intrinsic capacitance of the first acoustic wave resonator and the second acoustic wave resonator respectively.

7. The filter circuit of claim 1, wherein the first acoustic wave resonator comprises a surface acoustic wave (SAW) resonator.

8. The filter circuit of claim 1, wherein the first acoustic wave resonator comprises a bulk acoustic wave (BAW) resonator.

9. The filter circuit of claim 1, further comprising an external capacitance connected parallel to at least one of the first filter branch or the second filter branch.

10. The filter circuit of claim 1, further comprising a series capacitance connected in series with the first acoustic wave resonator.

11. A filter circuit, comprising:
a first circuit port;
a second circuit port;
a first filter branch connected between the first circuit port and the second circuit port, the first filter branch comprising:
    a first plurality of parallel acoustic wave resonators transverse to the first circuit port and the second circuit port; and
    a plurality of series capacitances, each connected in series with a respective parallel acoustic wave resonator of the first plurality of parallel acoustic wave resonators; and
a second filter branch connected between the first circuit port and the second circuit port and comprising a second plurality of parallel acoustic wave resonators transverse to the first circuit port and the second circuit port;
wherein the second filter branch has a phase shift from the first filter branch.

12. The filter circuit of claim 11, further comprising a balun circuit connected between the second filter branch and the second circuit port and connected between the first filter branch and the second circuit port such that the second filter branch has the phase shift from the first filter branch.

13. The filter circuit of claim 11, wherein the second filter branch further comprises a phase shift circuit connected between the second plurality of parallel acoustic wave resonators and the second circuit port and configured to cause the phase shift to be between 160 degrees and 200 degrees.

14. A filter circuit, comprising:
a first circuit port;
a first filter branch connected between the first circuit port and a first differential node and comprising a first plurality of parallel acoustic wave resonators;
a second filter branch connected between the first circuit port and a second differential node and comprising at least one acoustic wave resonator; and
a phase shift circuit connected between the second differential node and a second circuit port;
wherein:
    the first differential node is connected to the second circuit port; and
    the phase shift circuit provides between a 160 degree and 200 degree phase shift from the first filter branch.

15. The filter circuit of claim 14, further comprising a balun circuit connected between the first differential node, the second differential node, and the second circuit port such that the balun circuit functions as the phase shift circuit.

16. The filter circuit of claim 14, wherein the second filter branch comprises a second plurality of parallel acoustic wave resonators.

17. The filter circuit of claim 14, further comprising:
a plurality of series capacitances, each connected in series with a respective parallel acoustic wave resonator of the first plurality of parallel acoustic wave resonators; and
a second series capacitance connected in series with the at least one acoustic wave resonator.

18. The filter circuit of claim 14, wherein:
each of the first plurality of parallel acoustic wave resonators comprises a surface acoustic wave (SAW) resonator; and
the at least one acoustic wave resonator comprises a SAW resonator.

19. The filter circuit of claim 14, wherein:
each of the first plurality of parallel acoustic wave resonators comprises a bulk acoustic wave (BAW) resonator; and
the at least one acoustic wave resonator comprises a BAW resonator.

20. The filter circuit of claim 14, further comprising:
an impedance matching network connected in shunt with at least one of the first circuit port, the first differential node, or the second differential node.

* * * * *